(12) United States Patent
Yeates et al.

(10) Patent No.: US 8,072,764 B2
(45) Date of Patent: Dec. 6, 2011

(54) MULTI-PART SUBSTRATE ASSEMBLIES FOR LOW PROFILE PORTABLE ELECTRONIC DEVICES

(75) Inventors: Kyle H. Yeates, Palo Alto, CA (US); James Bilanski, Palo Alto, CA (US); Dennis Pyper, San Jose, CA (US)

(73) Assignee: Apple Inc., Cupertino, CA (US)

( * ) Notice: Subject to any disclaimer, the term of this patent is extended or adjusted under 35 U.S.C. 154(b) by 452 days.

(21) Appl. No.: 12/400,692

(22) Filed: Mar. 9, 2009

(65) Prior Publication Data

US 2010/0226101 A1   Sep. 9, 2010

(51) Int. Cl.
*H05K 1/00* (2006.01)
*H05K 1/18* (2006.01)
*H05K 7/00* (2006.01)
(52) U.S. Cl. ............................ 361/748; 361/749
(58) Field of Classification Search .............. 361/760, 361/776, 777, 749
See application file for complete search history.

(56) References Cited

U.S. PATENT DOCUMENTS

| | | | | |
|---|---|---|---|---|
| 6,104,464 A | * | 8/2000 | Adachi et al. | 349/150 |
| 6,765,502 B2 | * | 7/2004 | Boldy et al. | 341/22 |
| 6,924,496 B2 | * | 8/2005 | Manansala | 250/556 |
| 7,686,762 B1 | * | 3/2010 | Najafi et al. | 600/300 |
| 7,960,739 B2 | * | 6/2011 | Ishigami | 257/81 |
| 2004/0189926 A1 | * | 9/2004 | Yamaji et al. | 349/149 |
| 2007/0133184 A1 | * | 6/2007 | Ho | 361/760 |
| 2007/0167041 A1 | * | 7/2007 | Chao et al. | 439/77 |
| 2007/0270180 A1 | * | 11/2007 | Takagi | 455/550.1 |
| 2008/0013959 A1 | * | 1/2008 | Ishigami | 398/135 |
| 2008/0062658 A1 | * | 3/2008 | Oowaki | 361/749 |
| 2008/0197352 A1 | * | 8/2008 | Chen et al. | 257/48 |
| 2008/0286994 A1 | * | 11/2008 | Takizawa | 439/83 |
| 2009/0016035 A1 | * | 1/2009 | Chritz | 361/760 |
| 2010/0065742 A1 | * | 3/2010 | Kobayashi et al. | 250/336.1 |
| 2010/0170700 A1 | * | 7/2010 | Nakamura et al. | 174/254 |

* cited by examiner

*Primary Examiner* — Lisa Lea Edmonds
*Assistant Examiner* — Xanthia C Cunningham

(57) ABSTRACT

Multi-part substrate arrangements that yield low profile configurations are disclosed. One aspect pertains to portable electronic devices are able to have low profiles through use of multi-part substrate arrangements. Another aspect pertains to methods for assembling two or more separate substrates into a multi-part substrate. By use of multi-part substrate arrangements according to the invention, portable electronic devices are able to be thinner and more compact.

33 Claims, 10 Drawing Sheets

MULTI-PART SUBSTRATE ASSEMBLIES FOR LOW PROFILE PORTABLE ELECTRONIC DEVICES

BACKGROUND OF THE INVENTION

1. Field of the Invention

The invention relates to substrates for electronic devices and, more particularly, to substrate assemblies for portable electronic devices.

2. Description of the Related Art

In recent years portable electronic devices, such as mobile telephones, personal digital assistants, portable media players, portable game players, have surged in popularity. Consequently, there is significant competition in the marketplace amongst competing products. As a result, there is pressure on companies to provide new and desirable products. On way to provide new and desirable products is to make the portable electronic smaller while at the same time making them even more powerful. Providing more is less space requires continuous innovative to continue to provide new and desirable products.

A principle component of a portable electronic device is a printed circuit board. Hence, the thickness of the printed circuit board with various electrical components attached often serves as a significant factor to the overall product thickness. Accordingly, the ability to reduce the height of the printed circuit board is of interest to product designers. It is not uncommon today for a portable electronic device to use one or more secondary circuit boards (or flexible circuits) with a main printed circuit board. In either case, the overall height utilized increases since the secondary circuit boards are stacked on the main printed circuit board where they are interconnected using connectors or soldered connections. Unfortunately, however, the increased height when using secondary circuit boards makes it difficult for portable electronic devices to continue to get thinner.

SUMMARY OF THE INVENTION

The invention pertains to multi-part substrate arrangement that yield low profile configurations. One aspect of the invention pertains to portable electronic devices that are able to have low profiles through use of multi-part substrate arrangements. Another aspect of the invention pertains to methods for assembling two or more separate substrates into a multi-part substrate. By use of multi-part substrate arrangements according to the invention, portable electronic devices are able to be thinner and more compact.

The invention may be implemented in numerous ways, including, but not limited to, as a method, system, device, or apparatus. Some exemplary embodiments of the invention are discussed below.

As a portable electronic device, one embodiment of the invention can, for example, include at least: a plurality of electrical components; a printed circuit board including a plurality of distinct electrical conductors for interconnecting the electrical components being attached to the printed circuit board, the printed circuit board having a recessed portion; and a flexible circuit placed within the recessed portion and attached and operatively coupled to the printed circuit board.

As an electronic device, one embodiment of the invention can, for example, include at least: a printed circuit board having a recessed portion near an edge of the printed circuit board; and a flexible circuit placed within the recessed portion and attached and operatively coupled to the printed circuit board via an anisotropic conductive film disposed between the flexible circuit and the printed circuit board. In one implementation, the combined thickness of the flexible circuit and the anisotropic conductive film is less than or equal to the depth of the recessed portion in the printed circuit board.

As a method for connecting a flexible circuit to a printed circuit board, one embodiment of the invention can, for example, include at least: obtaining a printed circuit board having a formed recess; placing a portion of a flexible circuit in the formed recess of the printed circuit board; and coupling the flexible circuit to the printed circuit board in the formed recess.

As a method for connecting a flexible circuit to a printed circuit board, one embodiment of the invention can, for example, include at least: forming a recessed region in printed circuit board, the recessed region including alignment targets; applying a conductive film within a portion of the recessed region; placing a flexible circuit within the recessed region over the conductive film; aligning the flexible circuit to the recessed region of the printed circuit board over the conductive film using the alignment targets in the recessed region; and applying heat and pressure to the conductive film to provide electrical interconnection and mechanical bonding between the flexible circuit and the printed circuit board.

Various aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

The invention pertains to multi-part substrate arrangement that yield low profile configurations. One aspect of the invention pertains to portable electronic devices that are able to have low profiles through use of multi-part substrate arrangements. Another aspect of the invention pertains to methods for assembling two or more separate substrates into a multi-part substrate. By use of multi-part substrate arrangements according to the invention, portable electronic devices are able to be thinner and more compact.

Exemplary embodiments of the invention are discussed below with reference to the various figures. However, those skilled in the art will readily appreciate that the detailed description given herein with respect to these figures is for explanatory purposes, as the invention extends beyond these embodiments.

Figure 1:
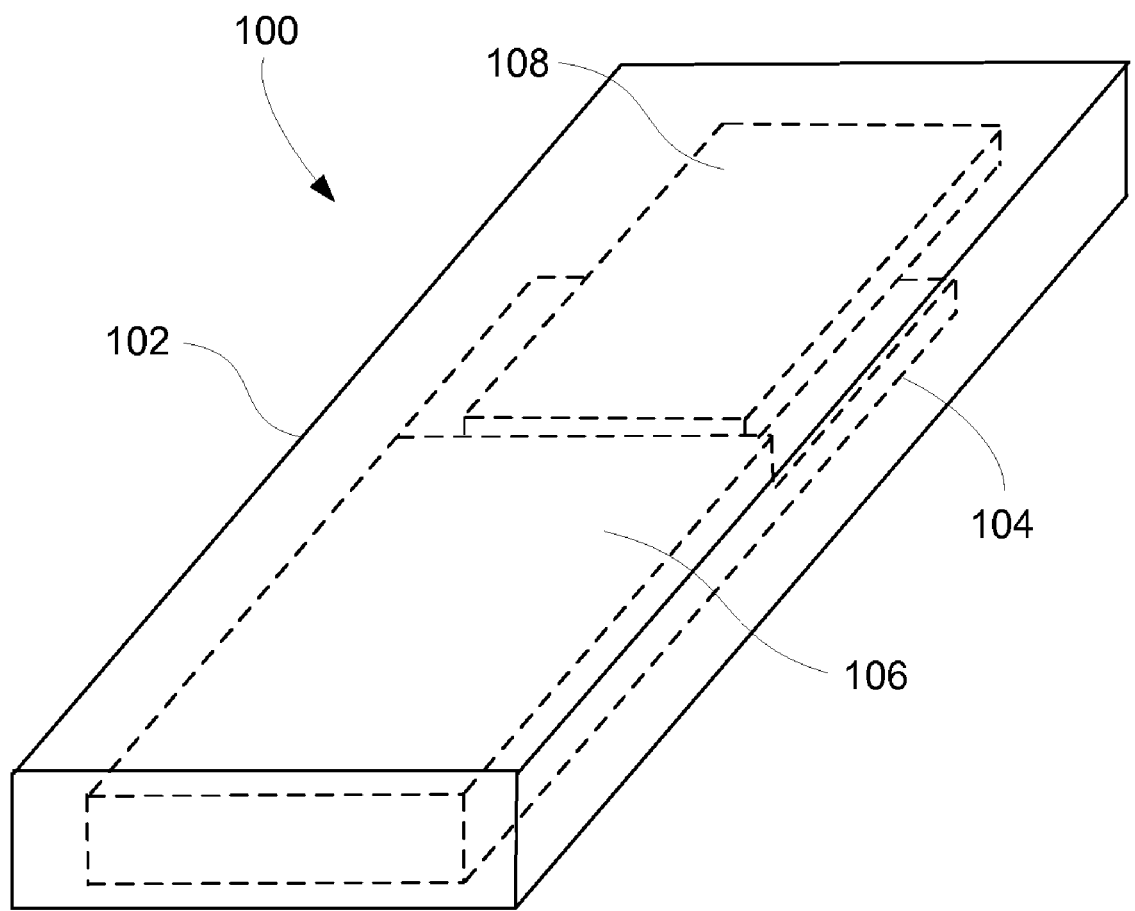
FIG. 1 is a perspective diagram of a portable electronic device according to one embodiment of the invention.

FIG. 1 is a perspective diagram of a portable electronic device 100 according to one embodiment of the invention. The portable electronic device 100 has a housing 102 that provides an external appearance for the portable electronic device 100. Internal to the housing 102 is a multi-part substrate 104. The multi-part substrate 104 can pertain to an assembly on two for more substrate parts. The substrate parts are substrates for electrical components, including electronic components, and provide conductive traces or pads for electrically connecting electrical components. In one embodiment, a first substrate part 106 can pertain to a base substrate, and a second substrate part 108 can pertain to a secondary substrate. The second substrate part 108 is able to be connected to the first substrate part 106 in a low profile manner, such that the height if the multi-part substrate 104 is less than the combined height of the first substrate part 104 and the second substrate part 108.

Accordingly, as discussed in more detail below, the multi-part substrate 104 has a low profile configuration. The low-profile configuration of the multi-part substrate 104 is advantageous because it permits the housing 102 for the portable electronic device 100 to also be low-profile. Consequently, the use of the multi-part substrate 104 within the portable electronic device 100 enables the portable electronic device 100 to be dramatically thin and compact.

Figure 2:
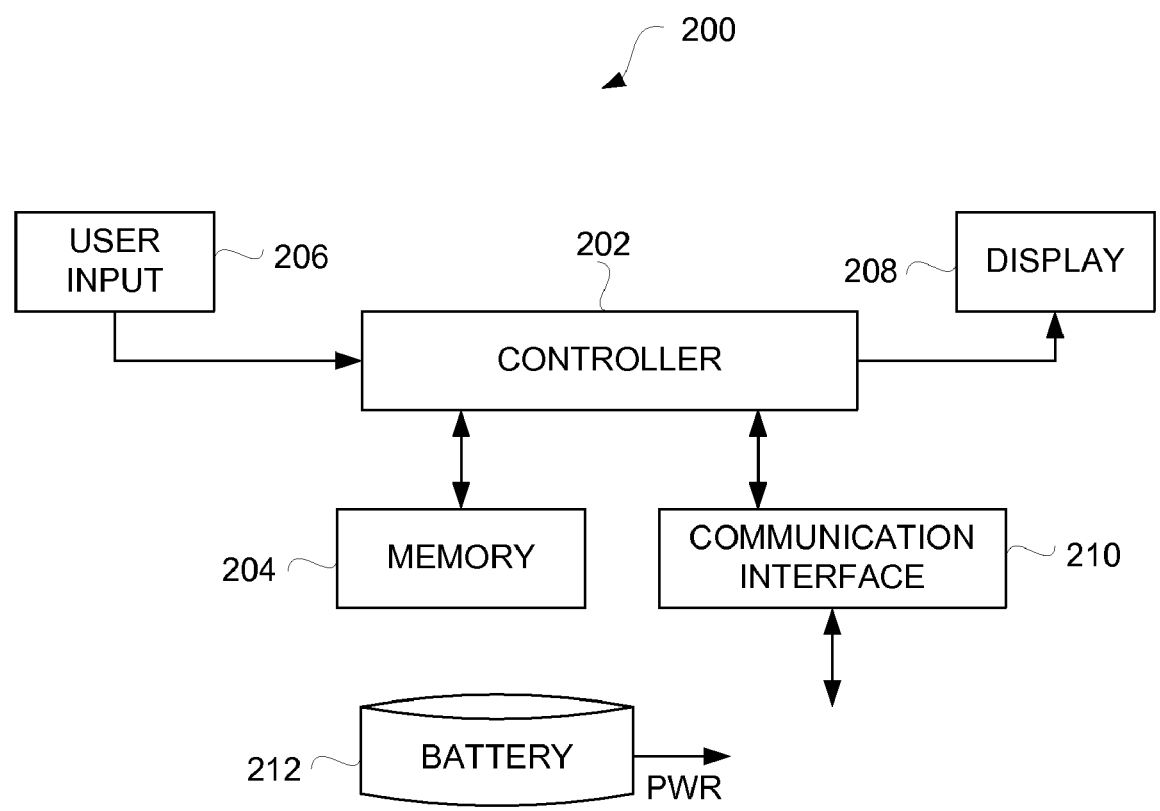
FIG. 2 is a schematic diagram of exemplary portable electronic device circuitry.

FIG. 2 is a schematic diagram of exemplary portable electronic device circuitry 200. The exemplary portable electronic device circuitry 200 can operate to provide the appropriate functionality to a portable electronic device, such as the portable electronic device 100 illustrated in FIG. 1. The exemplary portable electronic device circuitry 200 is, for example, circuitry that can be coupled to a multi-part substrate, such as the multi-part substrate 104.

The exemplary portable electronic device circuitry 200 includes a controller 202 that can control the overall operation of the portable electronic device 100. The controller 202 can couple to a memory 204 that provides data and/or program storage. A user input device 206 and a display device 208 can be coupled to the controller 202. The user input device 206 can pertain to a variety of different devices or input types, including a mouse, trackball, touchpad, touch surface, touch screen, and the like. The display device 208 is typically a small liquid crystal display. A communication interface 210 can also couple to the controller 202. The communication interface 210 can permit the portable electronic device 102 communicate data across a wired or wireless connection. Still further, the exemplary portable electronic device circuitry 200 can include a battery 212 that provides power to the various electrical components supporting functionality of the portable electronic device.

The exemplary portable electronic device circuitry 200 is merely one embodiment of circuitry that can be electrically interconnected using a multi-part substrate according to the invention. However, it should be understood that the nature and the functionality of a portable electronic device will determine the circuitry to be supported by a multi-part substrate. The electrical components that together form portions of the circuitry for a portable electronic device can be placed on one or more of the parts of the multi-part substrate.

FIGS. 3A-3D are perspectives views of a multi-part substrate according to one embodiment of the invention. The multi-part substrate is, for example, suitable for use as the multi-part substrate 104 utilized in FIG. 1.

Figure 3A:
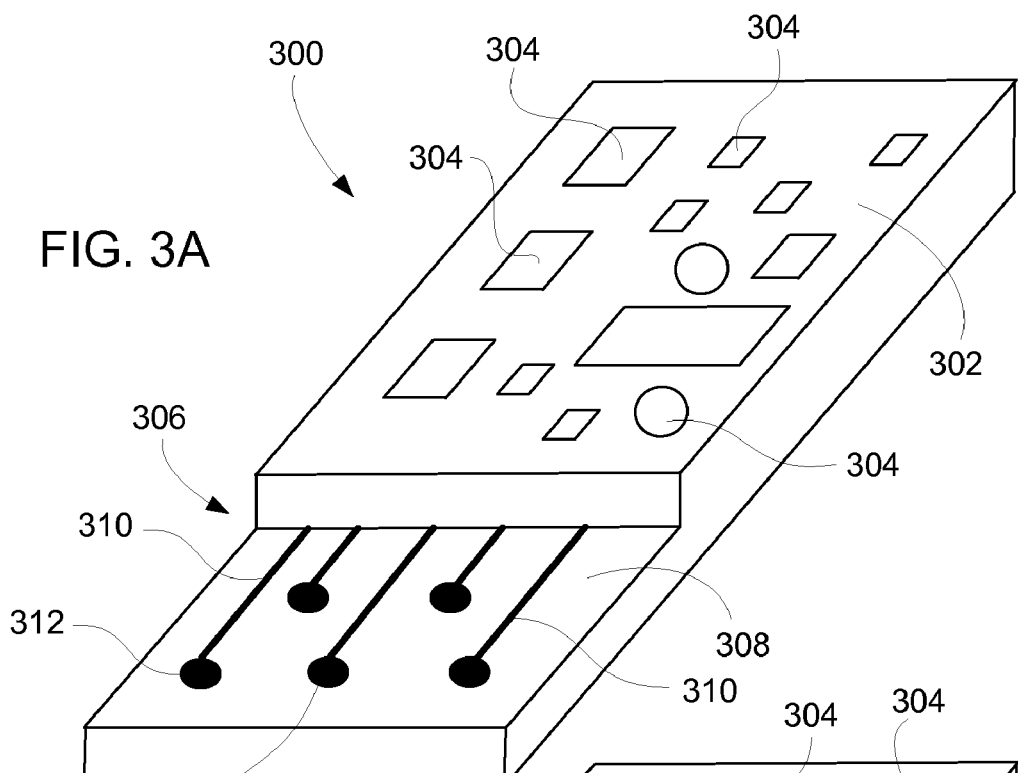
FIGS. 3A-3D are perspectives views of a multi-part substrate according to one embodiment of the invention.

FIG. 3A is a perspective view of a base portion 300 of a multi-part substrate according to one embodiment of the invention. The base portion 300 (or base part) is in one embodiment a multi-layered substrate, such as a printed circuit board having multiple laminated layers. The base portion 300 has at least a first surface 302 that has a plurality of electrical components 304 attached thereto. Other surfaces, although not shown, can also have electrical components attached thereto. The various electrical components 304 can very depend upon particular product application, but may include one or more of: integrated circuits, transistors, capacitors, inductors, resistors, batteries, display devices (e.g., liquid crystal displays), buttons, touch sensors or surfaces, and the like. In one embodiment, when the base portion 300 is a printed circuit board, the base portion 300 with the electrical component 304 attached thereto can be referred to as a printed circuit board assembly.

In addition, the base portion 300 includes a recessed portion 306. The recessed portion 306 is a region of the base portion 300 that has a reduced thickness. The exposed surface of the recessed portion 306 contains traces 310 and pads 312 that serve as conductive interfaces. The traces 310 and the pads 312 are metal conductors that are not only exposed on the exposed surface 308 but also extend within the remaining region of the base portion 300 so as to provide various electrical interconnections.

Figure 3B:
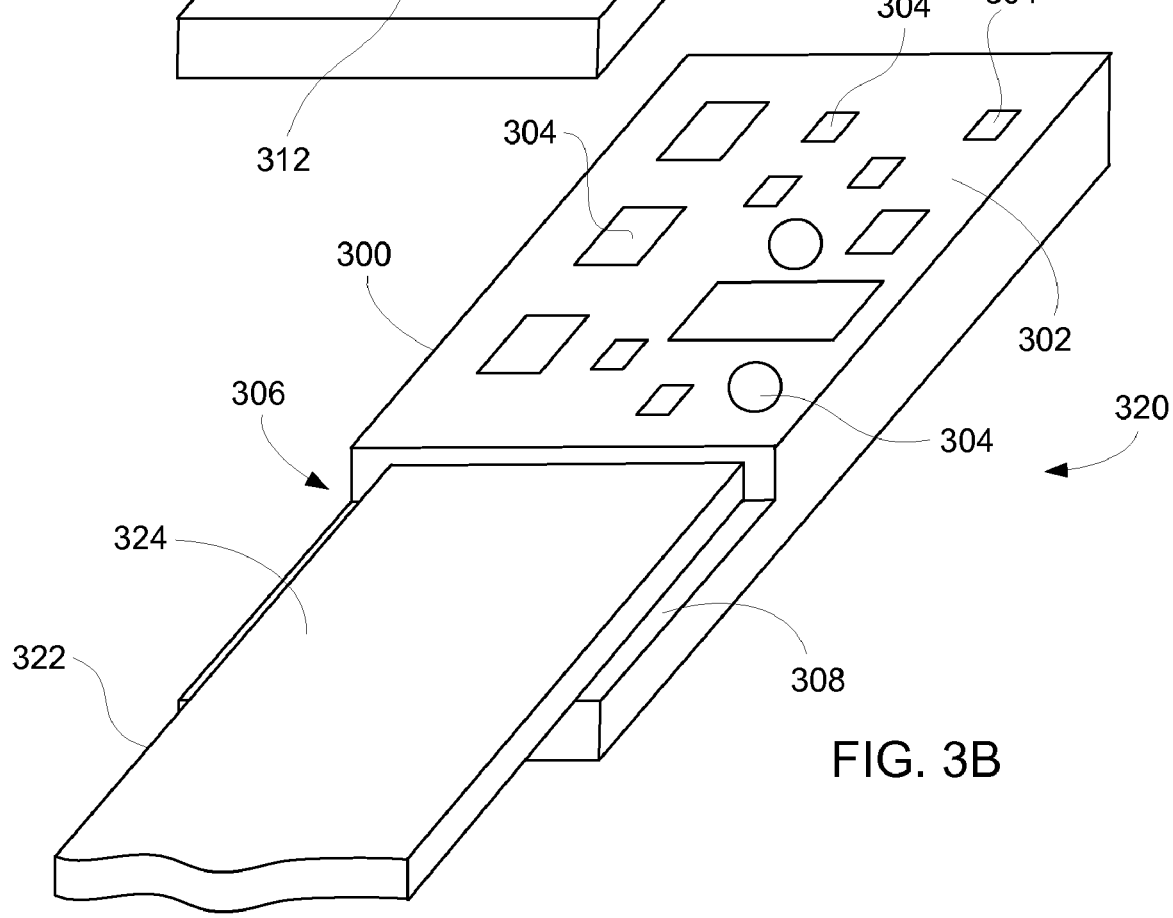

FIG. 3B is a perspective view of a multi-part substrate 320 having a flexible substrate 322 attached to the base portion 300 at the recessed portion 306. In one embodiment, as illustrated in FIG. 3B the height of the flexible substrate 322 is less than or equal to the depth of the recessed portion 306. Advantageously, the flexible substrate 322 is able to be mechanically and electrically connected to the base portion 300 without incurring any additional thickness beyond that required by the base portion 300.

The flexible substrate 322 includes a first surface 324. The first surface 324 can include conductive traces and/or pads as well as electrical components, although not illustrated in FIG. 3B. The mechanical and electrical connection between the flexible substrate 322 and the base portion 300 is further discussed below. However, it should be noted that the electrical connection between the flexible substrate 322 and the base portion 300 utilizes the traces 310 and the pads 312 on the exposed surface 308 of the recessed portion 306 to electrically couple to corresponding conductive areas on the underside of the flexible substrate 322.

Figure 3C:
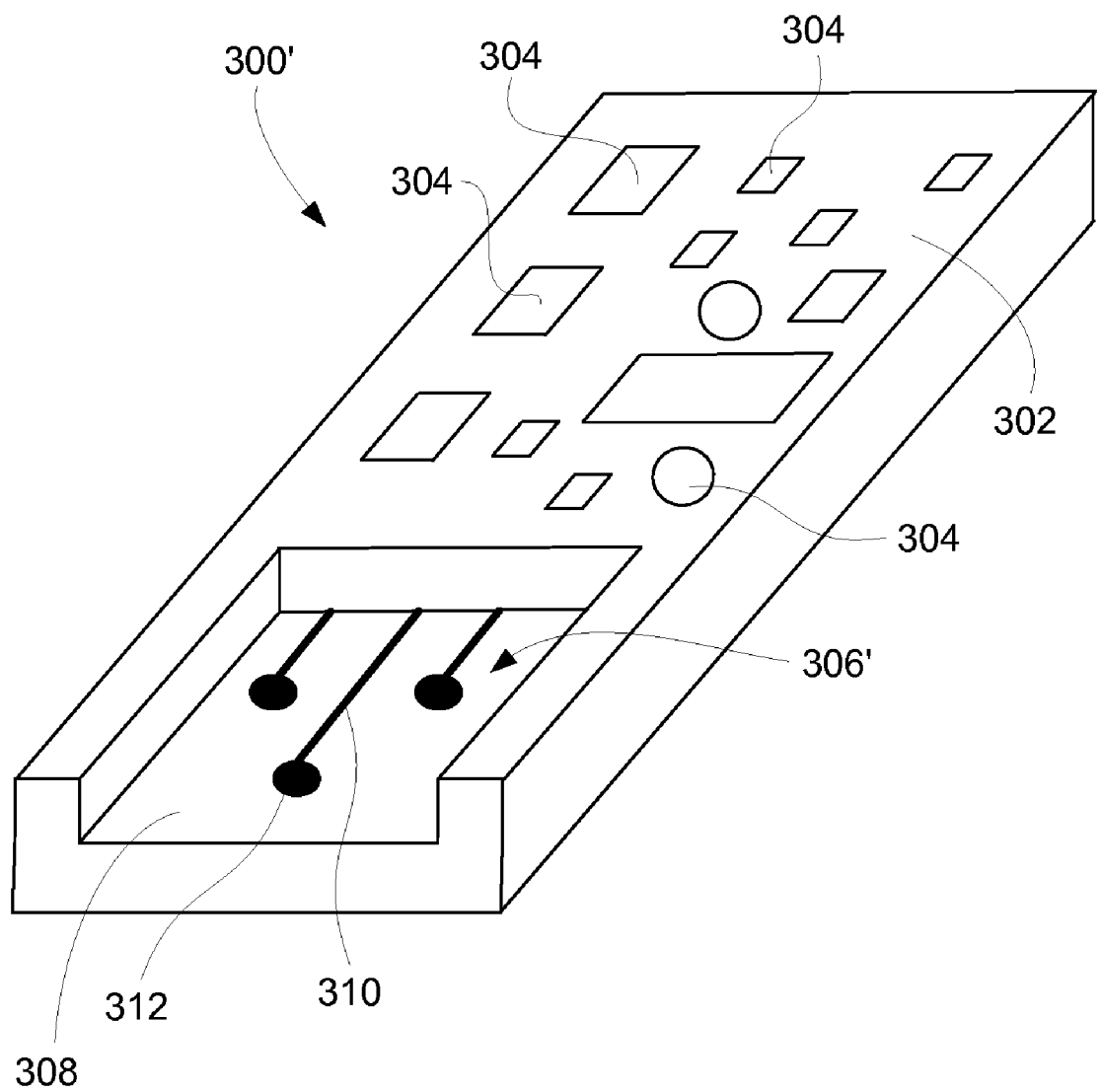

FIG. 3C is a perspective view of a base portion 300' of a multi-part substrate according to another embodiment of the invention. The base portion 300' illustrated in FIG. 3C is similar to the base portion 300 illustrated in FIG. 3A, except that a recessed portion 306' is configured differently than the recessed portion 306 illustrated in FIG. 3A. Specifically, the recessed portion 306' extends to a single and provides a slot or notch in the base portion 300'. The flexible substrate 322 shown in FIG. 3B can nevertheless couple to the recessed portion 306' in the same manner.

Figure 3D:
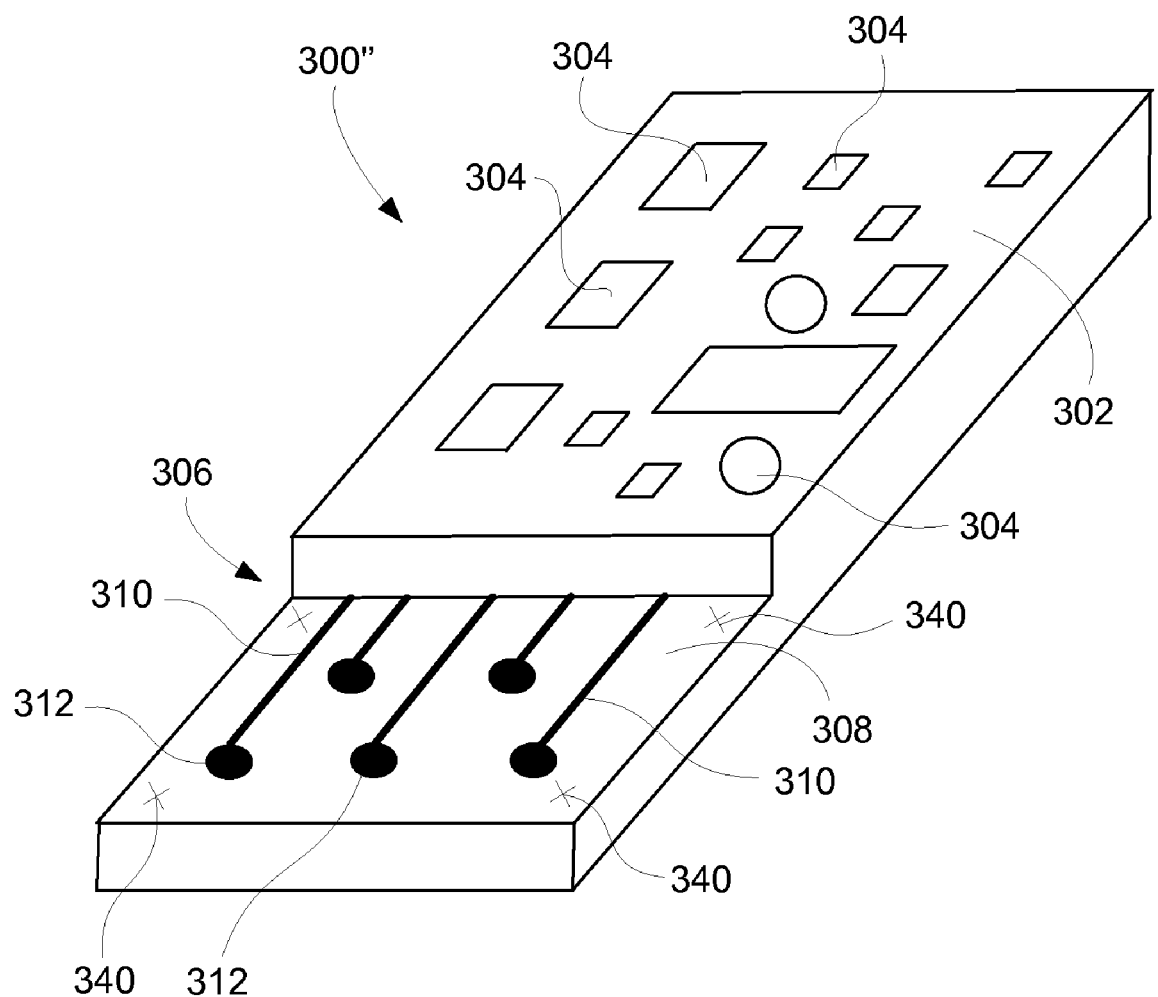

FIG. 3D is a perspective view of a base portion 300" of a multi-part substrate according to another embodiment of the invention. The base portion 300' illustrated in FIG. 3D is similar to the base portion 300 illustrated in FIG. 3A, except that the recessed portion 306 further illustrates one or more target markings 340 (or alignment targets) on the exposed surface 308 of the recessed portion 306. The target markings 340 can be used by computerized equipment having machine vision to precisely position the flexible circuit 322 with respect to the recessed region 306 of the base portion 300".

Figure 4:
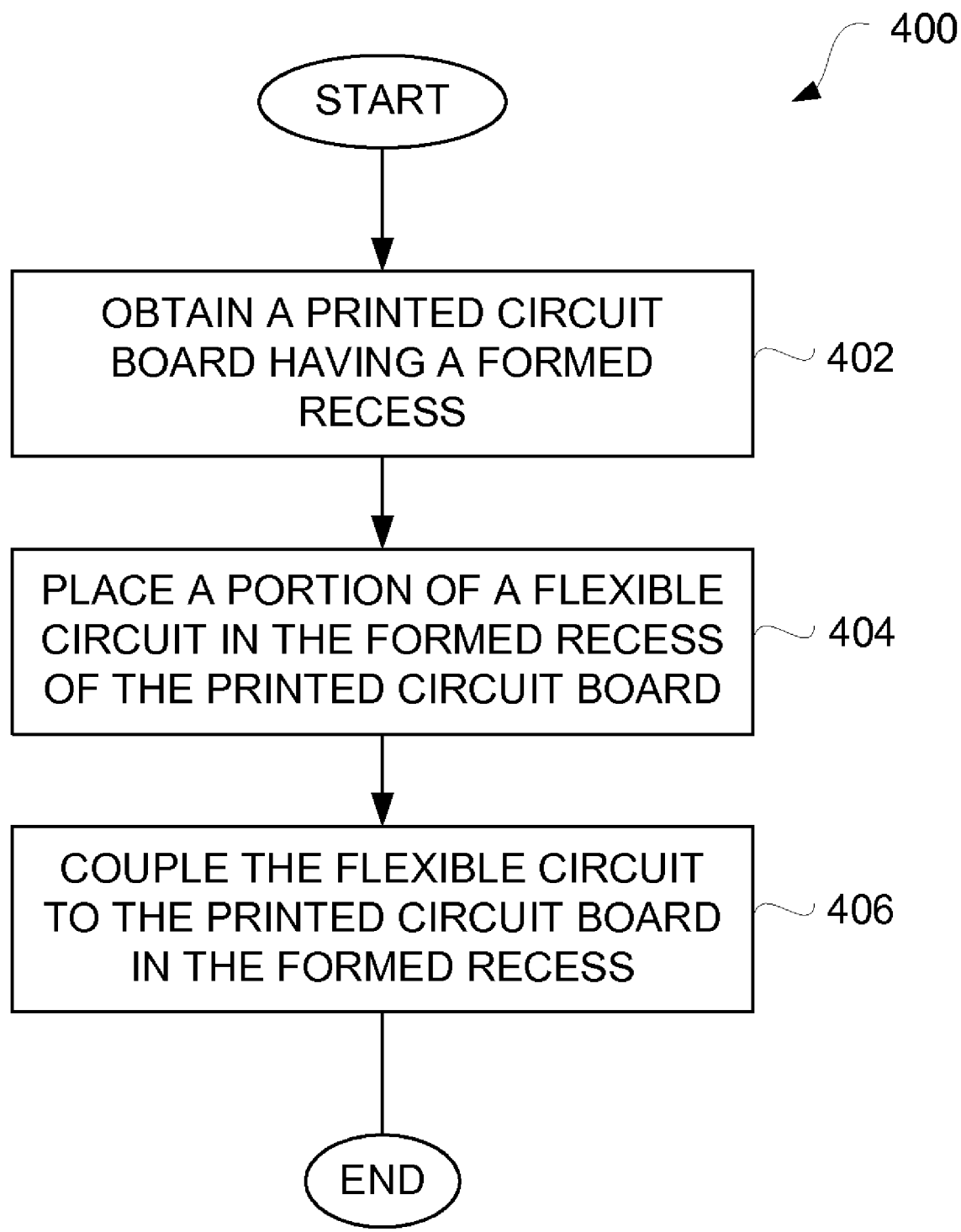
FIG. 4 is a flow diagram of a multi-part substrate assembly process according to one embodiment of the invention.

FIG. 4 is a flow diagram of a multi-part substrate assembly process 400 according to one embodiment of the invention. The multi-part substrate assembly process 400 can obtain 402 a printed circuit board having a formed recess. The printed circuit board can also be more generally referred to as a base substrate or a rigid substrate. In one implementation, the formed recess is provided at an edge of the printed circuit board. In another implementation, the formed recess is a cavity in the printed circuit board and need not be formed at an edge of the printed circuit board. The formation of the recess in the printed circuit board can be achieved in a variety of different ways, thought it is typically formed during manufacturer of the printed circuit board.

Next, a portion of a flexible circuit is placed 404 in the formed recess of the printed circuit board. Here, the flexible circuit (or flexible substrate) that is to be mechanically and electrically connected to the printed circuit board and is placed 404 in the appropriate position. In some embodiments, precise alignment can be utilized so that electrical connections can be reliably made between the flexible circuit and the printed circuit board.

After the flexible substrate has been placed 404 with respect to the formed recess of the printed circuit board, the flexible circuit can be coupled 406, both electrically and mechanically, to the printed circuit board in the formed recess. In one implementation, a conductive film can be interposed between the flexible circuit and the printed circuit board in the vicinity of the formed recess. The conductive film can facilitate the electrical connections (and possibly also the mechanical bonding) between the flexible circuit and the printed circuit board. The conductive film can also serve as an adhesive layer that secures the flexible circuit to the printed circuit board in the formed recess. In another implementation, a soldering technique (e.g., hand solder, bar solder) can be utilized to electrically and mechanically secure in the flexible substrate to the printed circuit board. Also, mechanical bonding can also be further provided through optional use of mechanical features or adhesive. After the flexible circuit has been coupled 406 to circuit board, the multi-part substrate assembly process 400 can end.

Figure 5:
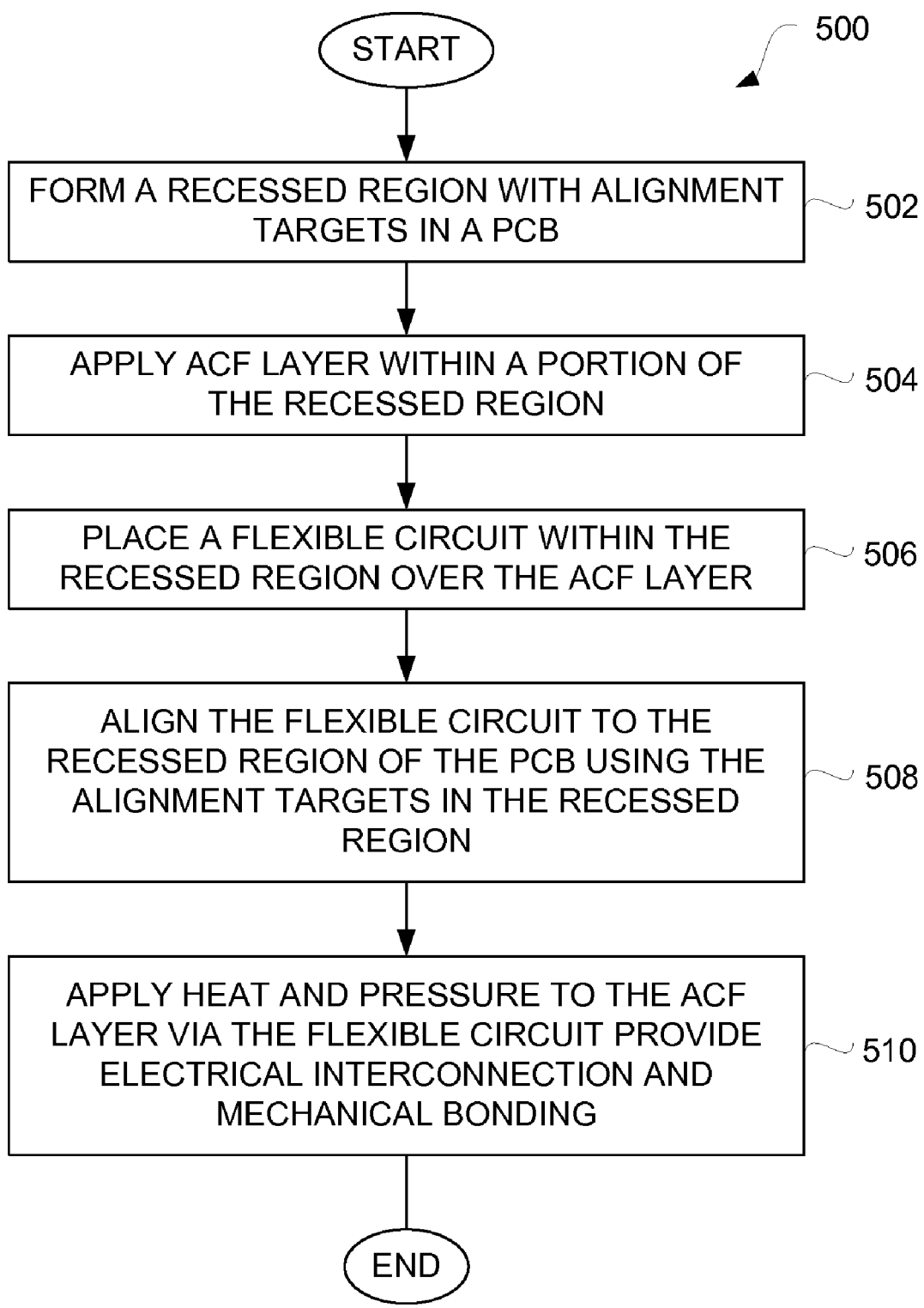
FIG. 5 is a flow diagram of a multi-part substrate assembly process according to one embodiment of the invention.

FIG. 5 is a flow diagram of a multi-part substrate assembly process 500 according to one embodiment of the invention. The multi-part substrate assembly process 500 can initially form 502 a recessed region with alignment targets in a printed circuit board (PCB). Next, an anisotropic conductive film (ACF) layer can be applied 504 within a portion of the recessed region. Next, a flexible circuit can be placed 506 within the recessed region over the ACF layer. At this point, the flexible circuit can be aligned 508 to the recessed region of the printed circuit board (PCB) using the alignment targets in the recessed region. Here, computerized equipment having machine vision can locate in the alignment targets and precisely position the flexible circuit with respect to the recessed region of the printed circuit board (PCB). Once the flexible circuit has been aligned 508 to the printed circuit board, heat and pressure can be applied 510 to the ACF layer via the flexible circuit so as to provide electrical interconnection and mechanical bonding. After the flexible circuit has been electrically and mechanically coupled to the printed circuit board at the recessed region, the multi-part substrate assembly process 500 can end.

FIGS. 6A-6D are cross-sectional side view diagrams illustrating operations of a multi-part substrate assembly process according to one embodiment of the invention. As one example, the diagrams illustrated in FIGS. 6A-6D can pertain to operations of the multi-part substrate assembly process 500 illustrated in FIG. 5.

Figure 6A:
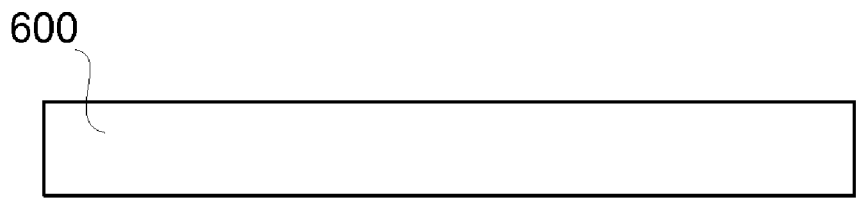
FIGS. 6A-6D are cross-sectional side view diagrams illustrating operations of a multi-part substrate assembly process according to one embodiment of the invention.

FIG. 6A illustrates a printed circuit board 600. The printed circuit board 600 is typically a primary electrical structure provided within a portable electronic device. For a portable electronic device that are to be thin, it is important that the printed circuit board also be thin. The particular thickness will, however, depend on the particular nature, design or type of portable electronic device. For example, in one embodiment, the thickness of the printed circuit board 600 can be in a range of 0.4 to 1.2 millimeters.

Figure 6B:
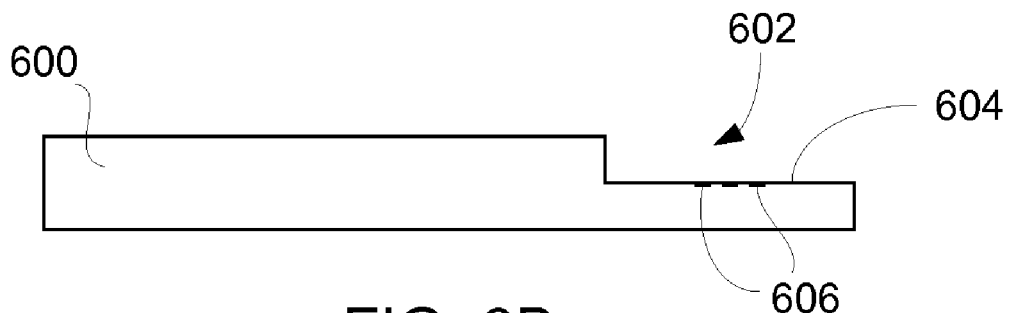

FIG. 6B illustrates the formation of a recessed region 602 in the printed circuit board 600. The recessed region 602 has an exposed upper surface 604. On the exposed upper surface 604 are conductive regions 606, such as conductive traces and/or conductive pads. These conductive regions 606 can be electrically connected to other regions within the printed circuit board 600 to facilitate various electrical interconnections.

Figure 6C:
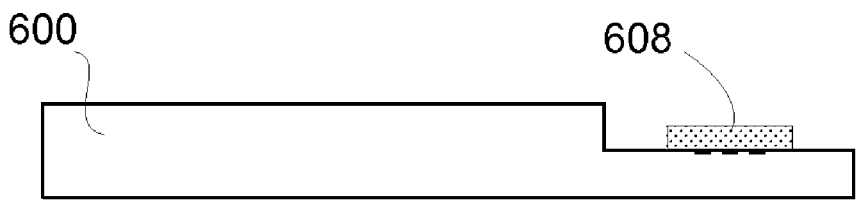

FIG. 6C illustrates a conductive film 608 being applied to the recessed region 602. The conductive film 608 is placed over the conductive regions 606 on the exposed upper surface 604. The conductive film 608 is, in one embodiment, an anisotropic conductive film. The thickness of the conductive film 608 (e.g., anisotropic conductive film) prior to compression is, for example, 100-300 microns.

Figure 6D:
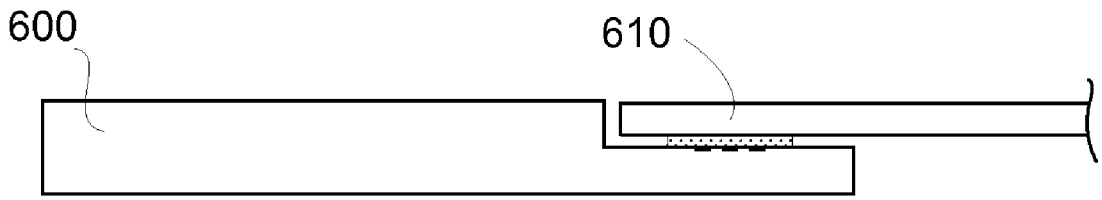

FIG. 6D illustrates a flexible substrate 610 being coupled to the printed circuit board 600 in the recessed region 602. In one embodiment, the flexible substrate 610 is flexible printed circuit product, such as a flex circuit. In one implementation, these flexible printed circuit products utilize a polyimide film, such as Kapton®. As illustrated in FIG. 6D, the flexible substrate 610 has been mechanically and electrically connected to the printed circuit board 600 using the conductive film 608. Here, the conductive film 608 has been activated through application of heat and pressure to provide not only electrical connection (e.g., in the Z direction) but also mechanical bonding, such as through adhesive. The thickness of the conductive film 608 (e.g., anisotropic conductive film) following compression is now, for example, 5-15 microns.

It should be noted that once assembled, in one embodiment, the combined height of the flexible substrate 610 and the conductive film 608 is less than or equal to the depth of the recessed region 602. For example, the depth of the recessed region 602 might be 0.2 mm, the thickness of the flexible substrate 610 might be 0.15 mm, and the thickness of the conductive film 608 might be 0.04 mm. In such an example, the combined thickness of the flexible substrate 610 and the conductive film 608 is 0.19 mm which is less than 0.2 mm, the depth of the recessed region 602.

FIG. 6D illustrates a single flexible substrate coupled to a base substrate (e.g., printed circuit board). More generally, however, one or more flexible substrates can be coupled to a base substrate at one or more recesses. The position and depth of the one or more recesses can vary.

Figure 7:
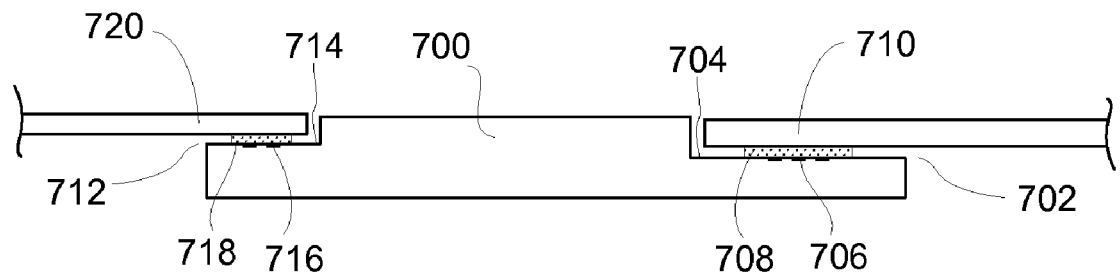
FIG. 7 illustrates a substrate arrangement having a base substrate with a first flexible substrate and a second flexible substrate coupled thereto, according to one embodiment of the invention.

FIG. 7 illustrates a substrate arrangement having a base substrate 700 with a first flexible substrate 710 and a second flexible substrate 720 coupled thereto, according to one embodiment of the invention. The first flexible substrate 710 is coupled to the base substrate 700 at a first recessed region 702. The second flexible substrate 720 is coupled to the base substrate 700 at a second recessed region 712.

The first recessed region 702 has an exposed upper surface 704. On the exposed upper surface 704 are conductive regions 706, such as conductive traces and/or conductive pads. The conductive regions 706 can be electrically connected to other regions within the base substrate 700 to facilitate various electrical interconnections. A conductive film 708 can be placed over the conductive regions 706 on the exposed upper surface 704 at the first recessed region 702. The conductive film 708 operates to mechanically and electrically connect the first flexible substrate 710 to the base substrate 700.

The second recessed region 712 has an exposed upper surface 714. On the exposed upper surface 714 are conductive regions 716, such as conductive traces and/or conductive pads. The conductive regions 716 can be electrically connected to other regions within the base substrate 700 to facilitate various electrical interconnections. A conductive film 718 can be placed over the conductive regions 716 on the exposed upper surface 714 at the second recessed region 712. The conductive film 718 operates to mechanically and electrically connect the second flexible substrate 720 to the base substrate 700.

Figure 8:
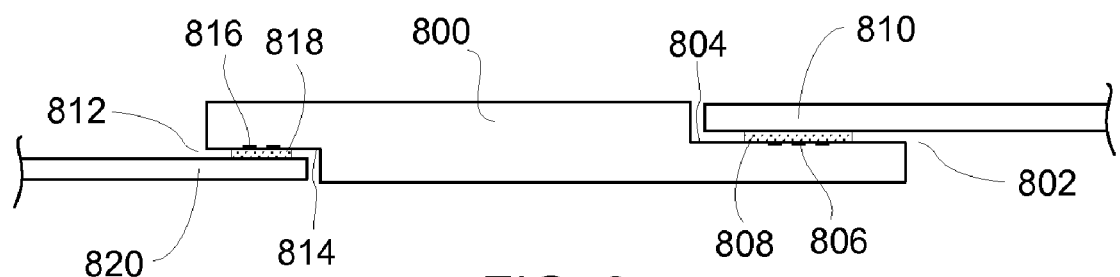
FIG. 8 illustrates a substrate arrangement having a base substrate with a first flexible substrate and a second flexible substrate coupled thereto, according to one embodiment of the invention.

FIG. 8 illustrates a substrate arrangement having a base substrate 800 with a first flexible substrate 810 and a second flexible substrate 820 coupled thereto, according to one embodiment of the invention. The first flexible substrate 810 is coupled to the base substrate 800 at a first recessed region 802. The second flexible substrate 820 is coupled to the substrate 800 at a second recessed region 812. The substrate arrangement illustrated in FIG. 8 is similar to the substrate arrangement illustrated in FIG. 7, except that the second flexible substrate 820 is placed on an opposite side of the base substrate 800.

The first recessed region 802 has an exposed upper surface 804. On the exposed upper surface 804 are conductive regions 806, such as conductive traces and/or conductive pads. The conductive regions 806 can be electrically connected to other regions within the base substrate 800 to facilitate various electrical interconnections. A conductive film 808 can be placed over the conductive regions 806 on the exposed upper surface 804 at the first recessed region 802. The conductive film 808 operates to mechanically and electrically connect the first flexible substrate 810 to the base substrate 800.

The second recessed region 812 has an exposed upper surface 814. On the exposed upper surface 814 are conductive regions 816, such as conductive traces and/or conductive pads. The conductive regions 816 can be electrically connected to other regions within the base substrate 800 to facilitate various electrical interconnections. A conductive film 818 can be placed over the conductive regions 816 on the exposed upper surface 814 at the second recessed region 812. The conductive film 818 operates to mechanically and electrically connect the second flexible substrate 820 to the base substrate 800.

Figure 9:
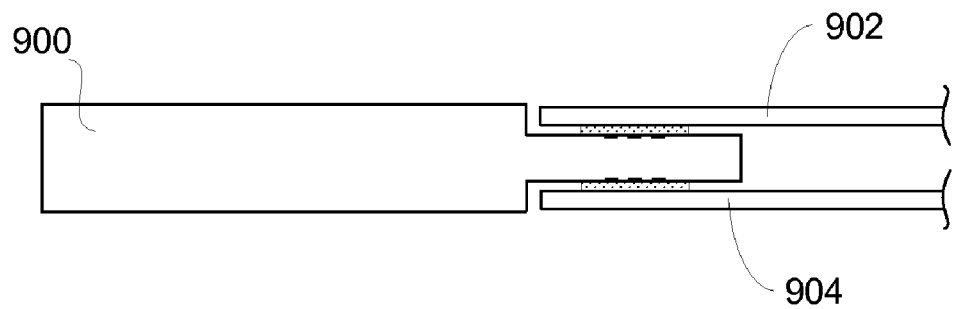
FIG. 9 illustrates a substrate arrangement according to another embodiment of the invention.

FIG. 9 illustrates a substrate arrangement according to another embodiment of the invention. In this embodiment, flexible substrates are attached to opposite sides of an edge of a base substrate. In particular, a base substrate 900 has a first recessed region that receives a first flexible substrate 902 and a second recessed region that receives a second flexible substrate 904. The base substrate 900 is, for example, a printed circuit board. The first flexible substrate 904 and the second flexible substrate 904 can be parts of a common flexible substrate or be separate substrates.

Figure 10:
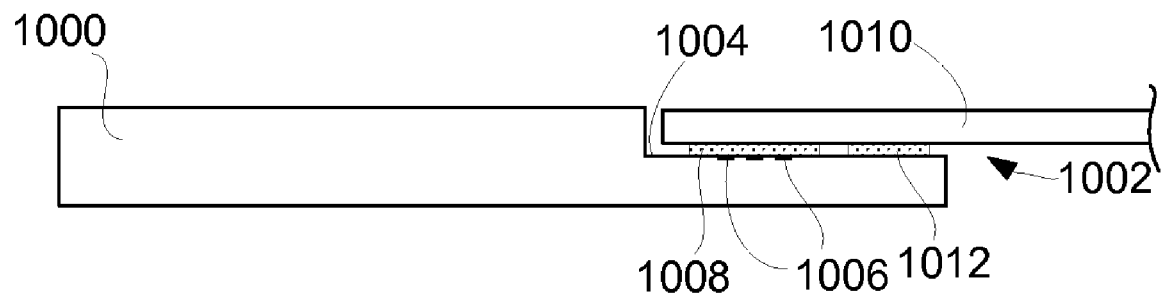
FIG. 10 illustrates a substrate arrangement according to another embodiment of the invention.

FIG. 10 illustrates a substrate arrangement according to another embodiment of the invention. In this embodiment, the substrate arrangement has a base substrate 1000 with a flexible substrate 1010 coupled thereto. The flexible substrate 1010 is coupled to the base substrate 1000 at a recessed region 1002. The recessed region 1002 has an exposed upper surface 1004. On the exposed upper surface 1004 are conductive regions 1006, such as conductive traces and/or conductive pads. The conductive regions 1006 can be electrically connected to other regions within the base substrate 1000 to facilitate various electrical interconnections. A conductive film 1008 can be placed over the conductive regions 1006 on the exposed upper surface 1004 at the recessed region 1002. The conductive film 1008 operates to facilitate electrical (and possibly mechanical) connection of the flexible substrate 1010 to the base substrate 1000.

The substrate arrangement illustrated in FIG. 10 is generally similar to the substrate arrangement illustrated in FIG. 6D. However, unlike FIG. 6D, in this embodiment, additional material is utilized to secure the flexible substrate 1010 to the base substrate 700. For example, the additional material can be an adhesive or an epoxy. In one embodiment, an adhesive layer 1012 can be provided on at least a portion of the recessed region 1002 in the base substrate 1000 to provide mechanical bonding between the flexible substrate 1010 and the recessed region 1002 of the base substrate 1002. The adhesive layer 1012 is typically non-conductive. However, the adhesive layer 1012 could potentially be conductive, such as when the adhesive layer is an anisotropic conductive film (ACF) layer. In this embodiment, the conductive film 1008 need not, but may, provide mechanical bonding between the flexible substrate 1010 and the recessed region 1002 of the base substrate 1002.

Figure 11:
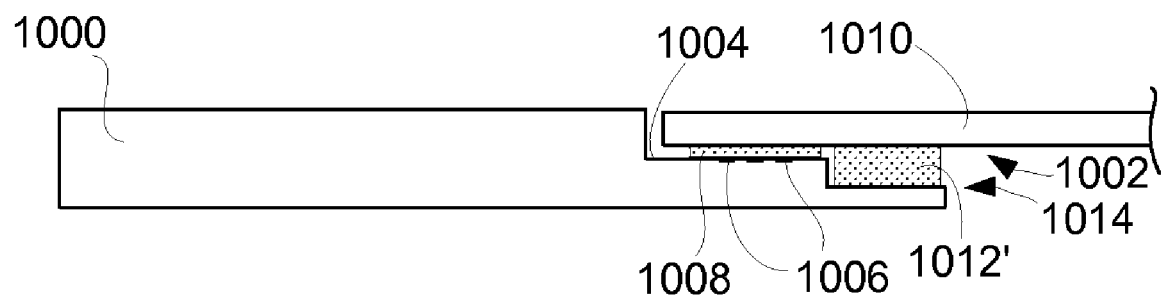
FIG. 11 illustrates a substrate arrangement according to still another embodiment of the invention.

FIG. 11 illustrates a substrate arrangement according to still another embodiment of the invention. In this embodiment, the substrate arrangement illustrated in FIG. 11 is generally similar to the substrate arrangement illustrated in FIG. 10 except that an adhesive layer 1012' is provided in a second recessed region 1014. Since the base substrate 1000 includes the second recessed region 1014, the adhesive layer 1012' is able to be thicker than the adhesive layer 1012 illustrated in FIG. 10. The thicker adhesive layer 1012' can provide greater mechanical bonding of the flexible substrate 1010 to the base substrate 1000. In one embodiment, the depth of the second recessed region 1014 is greater than the depth of the first recessed region 1002.

In various embodiments discussed above and illustrated in various figures a conductive film or layer is provided between a base substrate and a secondary substrate. The conductive film or layer is provided to facilitate electrical connection between the base substrate and the secondary substrate. Given the small, high density characteristics of multi-part substrates according to various embodiments, use of a conductive film or layers, such as an ACF layer, can be more efficient than requiring soldering (e.g., hand soldering or bar soldering). However, it should be understood that various embodiments of the invention do not require use of any conductive file or layer between a base substrate and a secondary substrate.

It should also be noted that the recess or recessed region in a base substrate (e.g., printed circuit board) need not be linear or rectangular but can take any shape or geometry desired. Similarly, the shape or configuration of a secondary substrate (e.g., flexible circuit) can also be any shape or geometry, and need not match that of the recess or recessed region. The position of the recess or recessed region can be on any part or any significant surface of a base substrate.

The invention can be utilized in a variety of different devices (e.g., electronic devices) including, but not limited to including, portable and highly compact electronic devices (i.e., portable electronic devices) with limited dimensions and space. In one embodiment, a device utilizing the invention may be a laptop computer, a tablet computer, a media player, a mobile phone (e.g., cellular phone), a personal digital assistant (PDA), substantially any handheld electronic device, a computer mouse, a keyboard, a remote control, substantially any computer accessory, and/or substantially any computer peripheral. Typically, the electronic devices include at least one electrical component inside its housing.

The advantages of the invention are numerous. Different aspects, embodiments or implementations may yield one or more different advantages. One advantage of certain embodiments of the invention is that portable electronic devices can be produced with low profiles. In other words, the invention enables portable electronic device to be thinner and thus more compact and more appealing.

The various aspects, features, embodiments or implementations of the invention described above can be used alone or in various combinations.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A portable electronic device, comprising:
a plurality of electrical components;
a printed circuit board including a plurality of distinct electrical conductors for interconnecting the electrical components being attached to the printed circuit board, the printed circuit board having a recessed portion; and
a flexible circuit placed within the recessed portion and attached and operatively coupled to the printed circuit board.

2. A portable electronic device as recited in claim 1, wherein the thickness of the flexible circuit is less than or equal to the depth of the recessed portion in the printed circuit board.

3. A portable electronic device as recited in claim 1, wherein the recessed portion is formed near an edge of the printed circuit board.

4. A portable electronic device as recited in claim 1, wherein the portable electronic device further comprises a conductive film interposed between the flexible circuit and the printed circuit board in the recessed portion.

5. A portable electronic device as recited in claim 4, wherein the conductive film is an anisotropic conductive film.

6. A portable electronic device as recited in claim 5, wherein the combined thickness of the flexible circuit and the conductive film is less than or equal to the depth of the recessed portion in the printed circuit board.

7. A portable electronic device as recited in claim 4, wherein the conductive film is a conductive adhesive layer provided on a first region of the recessed portion between the flexible circuit and the printed circuit board.

8. A portable electronic device as recited in claim 7, wherein the portable electronic device further comprises a non-conductive adhesive layer provided on a second region of the recessed portion between the flexible circuit and the printed circuit board.

9. A portable electronic device as recited in claim 1, wherein the printed circuit board further includes another recessed portion.

10. A portable electronic device as recited in claim 9, wherein the depth of the another recessed portion is greater than the depth of the recessed portion.

11. A portable electronic device as recited in claim 10, wherein the portable electronic device further comprises a non-conductive adhesive layer provided on a least a portion of the another recessed portion between the flexible circuit and the printed circuit board.

12. A portable electronic device as recited in claim 9, wherein the portable electronic device further comprises another flexible circuit placed within the another recessed portion and attached and operatively coupled to the printed circuit board.

13. A portable electronic device as recited in claim 1, wherein the printed circuit board further includes a plurality of alignment features provided on the recessed portion, the alignment feature being used to accurately position the flexible circuit with respect to the printed circuit board at the recessed region.

14. A portable electronic device as recited in claim 1, wherein a plurality of the electrical conductors are exposed on an upper surface of the recessed portion, and wherein the flexible circuit is electrically connected to one or more of the plurality of the electrical conductors that are exposed on the upper surface of the recessed portion.

15. An electronic device, comprising:
a printed circuit board having a recessed portion near an edge of the printed circuit board; and
a flexible circuit placed within the recessed portion and attached and operatively coupled to the printed circuit board via an anisotropic conductive film disposed between the flexible circuit and the printed circuit board, wherein the combined thickness of the flexible circuit and the anisotropic conductive film is less than or equal to the depth of the recessed portion in the printed circuit board.

16. An electronic device as recited in claim 15, wherein the electronic device is a portable electronic device having a housing that contains the printed circuit board with the flexible circuit attached and operatively coupled thereto at the recessed portion, and
wherein the thickness of the housing is less than 2 centimeters.

17. An electronic device as recited in claim 15, wherein the electronic device is a hand-held electronic device having a housing that contains the printed circuit board with the flexible circuit attached and operatively coupled thereto at the recessed portion, and
wherein the thickness of the housing is less than 1 centimeter.

18. An electronic device as recited in claim 15, wherein the depth of the recessed portion is 0.1-0.6 millimeters.

19. An electronic device as recited in claim 15, wherein the depth of the recessed portion is about 0.2 millimeters.

20. A method for connecting a flexible circuit to a printed circuit board, said method comprising:
(a) obtaining a printed circuit board having a formed recess;
(b) placing a portion of a flexible circuit in the formed recess of the printed circuit board; and
(c) coupling the flexible circuit to the printed circuit board in the formed recess.

21. A method as recited in claim 20, wherein said coupling (c) comprises disposing a conductive film in the formed recess between the flexible circuit and the printed circuit board.

22. A method as recited in claim 21, wherein the formed recess has a depth, the flexible circuit has a first thickness, and the conductive film has a second thickness, and wherein the combined thickness of the first thickness and the second thickness is not greater than the depth of the formed recess.

23. A method as recited in claim 21, wherein the conductive film is a conductive adhesive film.

24. A method as recited in claim 21, wherein the conductive film is an anisotropic conductive film.

25. A method as recited in claim 20, wherein the formed recess abuts an edge of the printed circuit board.

26. A method as recited in claim 20, wherein said obtaining (a) comprises forming the recess in the printed circuit board.

27. A method as recited in claim 20,
wherein an upper surface of the formed recess includes exposed conductive contacts; and
wherein said coupling (c) electrically connects the flexible circuit to at least a plurality of the exposed conductive contacts in the formed recess.

28. A method as recited in claim 20, wherein said coupling (c) mechanically attaches the flexible circuit to the printed circuit board in the formed recess.

29. A method for connecting a flexible circuit to a printed circuit board, said method comprising:
forming a recessed region in printed circuit board, the recessed region including alignment targets;
applying a conductive film within a portion of the recessed region;
placing a flexible circuit within the recessed region over the conductive film;
aligning the flexible circuit to the recessed region of the printed circuit board over the conductive film using the alignment targets in the recessed region; and
applying heat and pressure to the conductive film to provide electrical interconnection and mechanical bonding between the flexible circuit and the printed circuit board.

30. A method as recited in claim 29, wherein the conductive file is an anisotropic conductive film.

31. A method as recited in claim 29, wherein said applying of the heat and pressure comprises applying heat and pressure to the conductive film via the flexible circuit.

32. A method as recited in claim 29, wherein the recessed region has a depth, the flexible circuit has a first thickness, and the conductive film has a second thickness, and
wherein the combined thickness of the first thickness and the second thickness is not greater than the depth of the formed recess.

33. A method as recited in claim 29, wherein the recessed region has a depth, the flexible circuit has a first thickness, and the conductive film has a second thickness, and
wherein the depth of the formed recess is greater than at least one of the first thickness and the second thickness.

* * * * *